(12) United States Patent
Pelley et al.

(10) Patent No.: US 8,796,855 B2
(45) Date of Patent: Aug. 5, 2014

(54) SEMICONDUCTOR DEVICES WITH NONCONDUCTIVE VIAS

(75) Inventors: Perry H. Pelley, Austin, TX (US); Michael B. McShane, Austin, TX (US); Tab A. Stephens, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/350,090

(22) Filed: Jan. 13, 2012

(65) Prior Publication Data

US 2013/0181350 A1 Jul. 18, 2013

(51) Int. Cl.
*H01L 23/48* (2006.01)
*H01L 23/52* (2006.01)
*H01L 29/40* (2006.01)

(52) U.S. Cl.
USPC ............ 257/754; 257/774; 257/758; 257/773

(58) Field of Classification Search
USPC .................................. 257/754, 774, 773, 758
See application file for complete search history.

(56) References Cited

U.S. PATENT DOCUMENTS

| | | | |
|---|---|---|---|
| 5,747,380 A | 5/1998 | Yu et al. | |
| 5,885,857 A | 3/1999 | Yamaha et al. | |
| 6,014,052 A | 1/2000 | Coupe, II | |
| 6,028,367 A | 2/2000 | Yu | |
| 6,081,021 A * | 6/2000 | Gambino et al. ............. | 257/530 |
| 6,109,775 A | 8/2000 | Tripathi et al. | |
| 6,204,559 B1 | 3/2001 | Lin et al. | |
| 6,281,583 B1 | 8/2001 | Dirahoui et al. | |
| 6,281,586 B1 | 8/2001 | Feurle et al. | |
| 6,306,755 B1 | 10/2001 | Zheng | |
| 6,358,836 B1 | 3/2002 | Lu et al. | |
| 6,407,464 B1 | 6/2002 | Terauchi | |
| 6,452,274 B1 | 9/2002 | Hasegawa et al. | |
| 6,455,894 B1 | 9/2002 | Matsumoto et al. | |
| 6,492,259 B2 | 12/2002 | Dirahoui et al. | |
| 6,570,243 B1 | 5/2003 | Hagihara | |
| 6,573,168 B2 | 6/2003 | Kim et al. | |
| 6,586,809 B2 | 7/2003 | Segawa | |
| 6,624,063 B2 | 9/2003 | Hasegawa et al. | |
| 6,717,268 B2 | 4/2004 | Hau-Riege | |
| 6,767,788 B2 * | 7/2004 | Kim .............................. | 438/253 |
| 6,806,178 B2 | 10/2004 | Segawa | |
| 6,833,323 B2 | 12/2004 | Yui et al. | |
| 6,870,230 B2 | 3/2005 | Matsuda et al. | |
| 6,897,125 B2 | 5/2005 | Morrow et al. | |
| 6,967,370 B2 | 11/2005 | Schroder et al. | |
| 6,989,583 B2 | 1/2006 | Fujii | |
| 6,998,664 B2 | 2/2006 | Vollrath et al. | |
| 7,002,239 B1 | 2/2006 | Nadarajah et al. | |
| 7,047,514 B2 | 5/2006 | Mizuno et al. | |

(Continued)

OTHER PUBLICATIONS

Rawlings, C., et al, "Raising the Bar for Hardware Security: Physical Layer Security in Standard CMOS", Technologies for Homeland Security, 2008 IEEE Conference, Mar. 3, 2008, pp. 263-268.

*Primary Examiner* — Chuong A. Luu
(74) *Attorney, Agent, or Firm* — Mary Jo Bertani; David G. Dolezal

(57) ABSTRACT

An electric device with vias that include dielectric structures to prevent conductive material in the vias from electrically connecting conductive structures on a top of the vias with conductive structures on the bottom of the vias. The dielectric structures are formed in selected vias where other vias do not include the dielectric structures.

17 Claims, 9 Drawing Sheets

(56) References Cited

U.S. PATENT DOCUMENTS

| | | |
|---|---|---|
| 7,056,813 B2 | 6/2006 | Morrow et al. |
| 7,084,478 B2 | 8/2006 | Lee et al. |
| 7,087,350 B2 | 8/2006 | Wang |
| 7,087,516 B2 | 8/2006 | Hau-Riege |
| 7,109,585 B2 | 9/2006 | Kang et al. |
| 7,112,883 B2 | 9/2006 | Hasunuma |
| 7,137,092 B2 | 11/2006 | Maeda |
| 7,148,116 B2 | 12/2006 | Lee et al. |
| 7,154,183 B2 | 12/2006 | Fujimaki |
| 7,157,787 B2 | 1/2007 | Kim et al. |
| 7,199,420 B2 | 4/2007 | Kitamura et al. |
| 7,224,069 B2 | 5/2007 | Chen |
| 7,294,932 B2 | 11/2007 | Hiroi |
| 7,301,229 B2 | 11/2007 | Yau |
| 7,301,236 B2 | 11/2007 | Greco et al. |
| 7,301,240 B2 | 11/2007 | Hasunuma et al. |
| 7,308,395 B2 | 12/2007 | Kaneko et al. |
| 7,321,522 B2 | 1/2008 | Dixon et al. |
| 7,339,218 B2 | 3/2008 | Hidaka et al. |
| 7,402,858 B2 | 7/2008 | Hidaka et al. |
| 7,417,319 B2 | 8/2008 | Hayashi et al. |
| 7,420,278 B2 | 9/2008 | Tomita |
| 7,429,508 B2 | 9/2008 | Hidaka et al. |
| 7,439,173 B2 | 10/2008 | Greco et al. |
| 7,439,623 B2 | 10/2008 | Harada |
| 7,470,981 B2 | 12/2008 | Egusa |
| 7,473,102 B2 | 1/2009 | Colgan et al. |
| 7,486,585 B2 | 2/2009 | Dixon et al. |
| 7,524,738 B2 | 4/2009 | Lee |
| 7,541,272 B2 | 6/2009 | Daubenspeck et al. |
| 7,545,045 B2 | 6/2009 | Huang et al. |
| 7,569,421 B2 | 8/2009 | Do et al. |
| 7,611,991 B2 | 11/2009 | Richter et al. |
| 7,737,547 B2 | 6/2010 | Asakawa |
| 7,750,480 B2 | 7/2010 | Kageyama |
| 7,759,800 B2 | 7/2010 | Rigg et al. |
| 7,777,341 B2 | 8/2010 | Kumagai |
| 7,781,335 B2 | 8/2010 | Isono |
| 2009/0230376 A1* | 9/2009 | Ryoo et al. .......... 257/2 |
| 2011/0080774 A1* | 4/2011 | Saito et al. .......... 365/163 |

\* cited by examiner

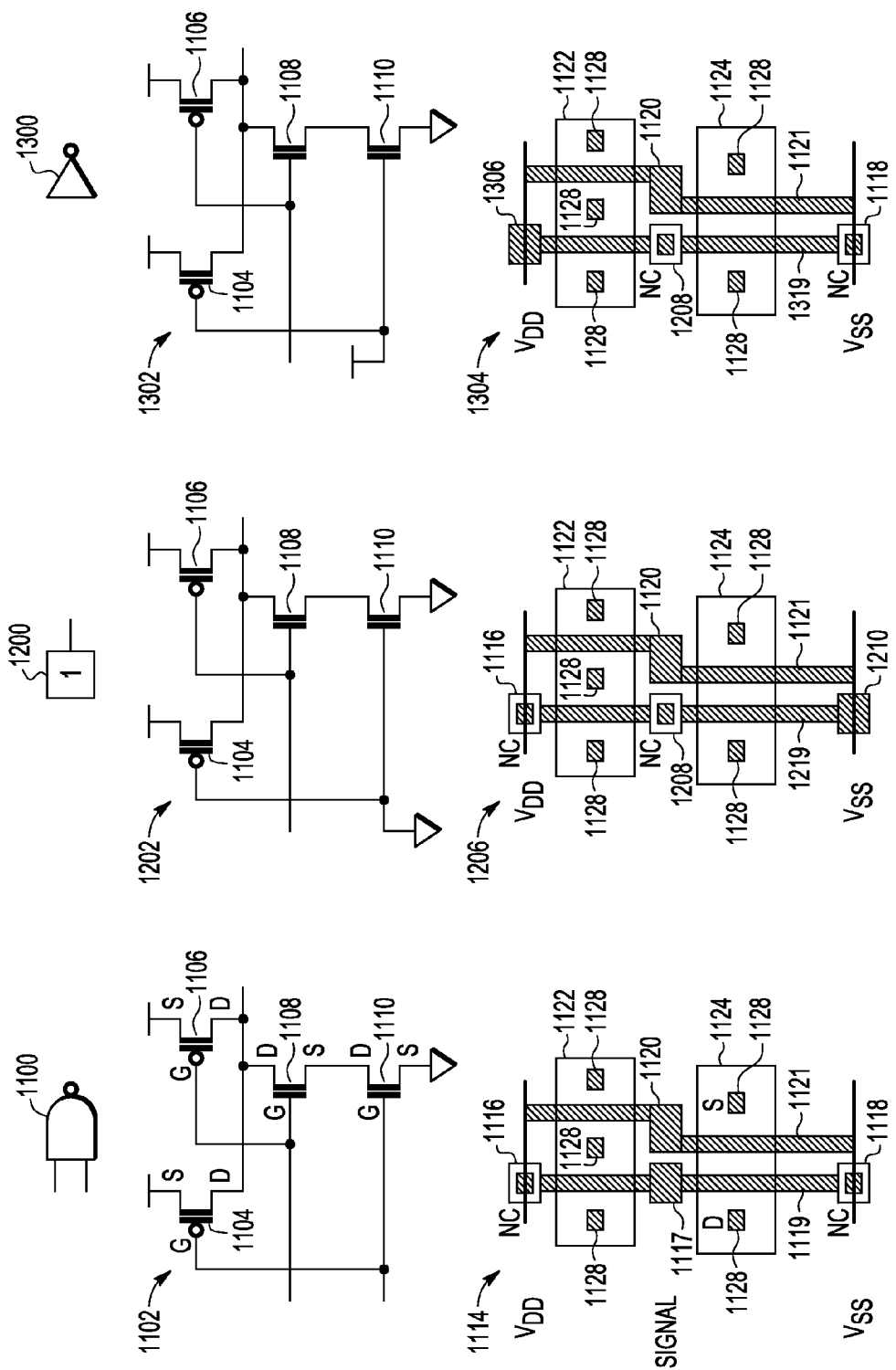

SEMICONDUCTOR DEVICES WITH NONCONDUCTIVE VIAS

BACKGROUND

1. Field

This disclosure relates generally to semiconductor devices, and more specifically, to semiconductor devices or integrated circuits with nonconductive vias.

2. Related Art

With the advent of advanced pattern recognition software that can extract schematics die layer photos of semiconductor devices as layers of semiconductor devices are removed during reverse engineering processes, unauthorized copying, production and sale of even the most complicated electric circuit designs has become possible.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

FIGS. 11-13 show examples of schematic and standard cell diagrams for circuits in which nonconductive vias formed as described for FIGS. 1-10 can be used.

DETAILED DESCRIPTION

Embodiments of devices and methods are disclosed herein that intentionally retain very thin dielectric material at the bottom or top of vias or contact holes to create nonconductive vias that are difficult if not impossible to detect through reverse engineering. The dielectric layer is removed when the conductive and nonconductive vias are removed. The inability to ascertain whether a via is intended to be conductive or nonconductive can render program code for ROM memory and circuits inoperable if all vias (including vias intended to be nonconductive vias) are implemented as conductive vias when copying a reversed engineered electric device. For complex die, large numbers of nonconductive vias can be used to render reverse engineered devices inoperable when vias that are intended to be nonconductive are actually conductive in circuit designs that have been copied without permission or authorization.

Figure 1:
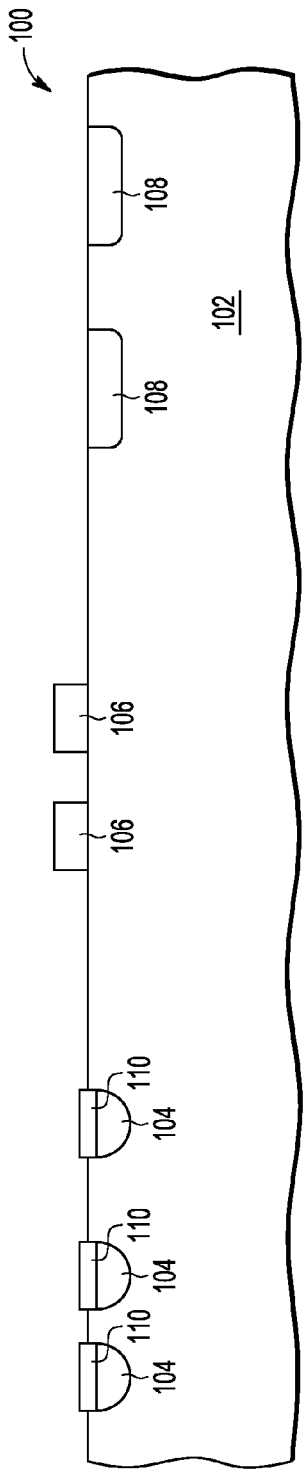
FIGS. 1-10 show a semiconductor device during successive phases of manufacture in accordance with embodiments of the present invention.

FIGS. 1-10 show a semiconductor device 100 during successive phases of manufacture in accordance with embodiments of the present invention. In FIG. 1, semiconductor device 100 is shown after an intermediate phase of manufacture during which doped regions 104, gate interconnects 106, and doped regions 108 have been formed on and/or in semiconductor substrate 102. Substrate 102 (also referred to as "a work piece") can be any suitable semiconductor material or combination of materials such as silicon, silicon on insulator, and/or gallium arsenide. Doped regions 104, 108 are electrically conductive and may be further processed to include silicided regions 110 formed of nickel, cobalt, or other suitable materials. Gate interconnects 106 are formed on the surface of substrate 102 using electrically conductive polysilicon, silicided polysilicon, or metal material. Other features, such as shallow trench isolation (STI) regions, are not shown but may be present. Gate interconnects 106 can be formed over the STI regions. The term "control terminal structure" as used herein for the gate of a transistor can include not only the portion of a gate interconnect 106 over the gate channel (not shown) but also the portion of the gate interconnect 106 outside the channel as well.

Figure 2:
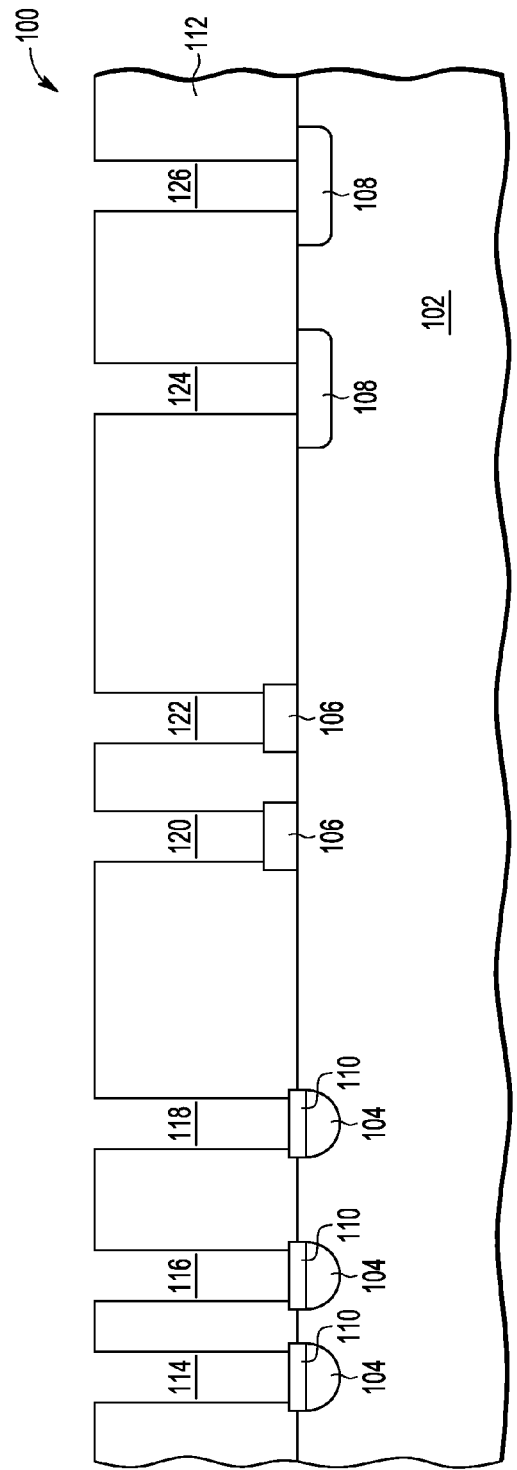

Referring to FIG. 2, semiconductor device 100 is shown after a subsequent phase of manufacture during which dielectric layer 112 has been formed over substrate 102, doped regions 104, 108, and gate interconnects 106. Dielectric layer 112 can be one or more layers of planarized material including one or more layers of oxide(s), low-K dielectric(s), tetraethyl-ortho-silicate (TEOS), and/or etch stop layer. Openings 114, 116, 118, 120, 122, 124, 126 are formed in dielectric layer 112 over respective doped regions 104, 108 and gate interconnects 106. Openings 114-126 can be formed by selectively patterning and etching completely through dielectric layer 112 to expose at least a portion of the tops of doped regions 104, 108 and gate interconnects 106, or to the tops of the silicide 110 formed on the doped regions 104, 108. Alternate techniques for forming openings 114-126 can be used, such as e-beam lithography, for example.

Figure 3:
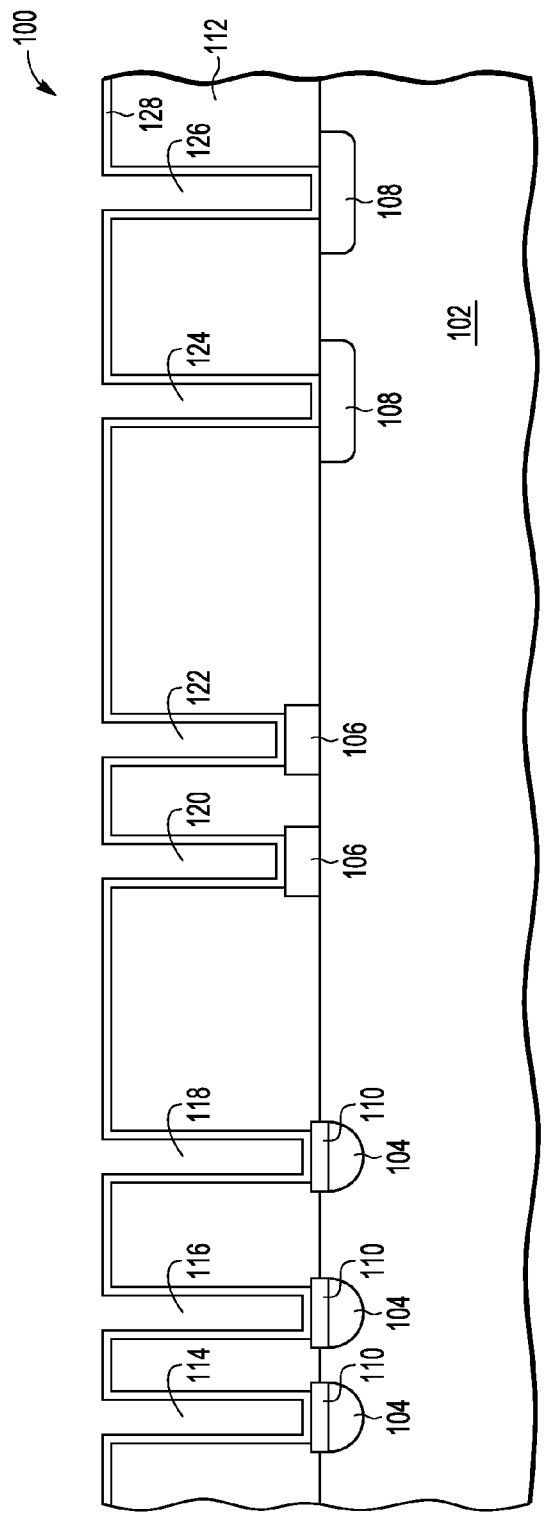

Referring to FIG. 3, semiconductor device 100 is shown after a subsequent phase of manufacture during which dielectric layer 128 is conformally deposited over dielectric layer 112 and along the sidewalls and bottoms of openings 114-126. Openings 114-126 are thus only partially filled with dielectric layer 128. Dielectric layers 112, 128 can be formed of the same or different dielectric material. For example, the same or similar dielectric materials can be used to make the presence of dielectric layer 128 more difficult to detect. As another example, different dielectric materials can be used where different etch properties are desired. Dielectric layer 128 is thick enough to create an open circuit between conductive features below selected ones of openings 114-126 (e.g., doped regions 104, 108 and gate interconnects 106) and conductive features above (not shown in FIG. 3) openings 114-126, as further described herein. For example, dielectric layer 128 can range from 100 to 200 Angstroms thick, or other thickness sufficient to render conductive vias in selected ones of openings 114-126 nonconductive with respect to conductive features in adjacent layers.

Figure 4:
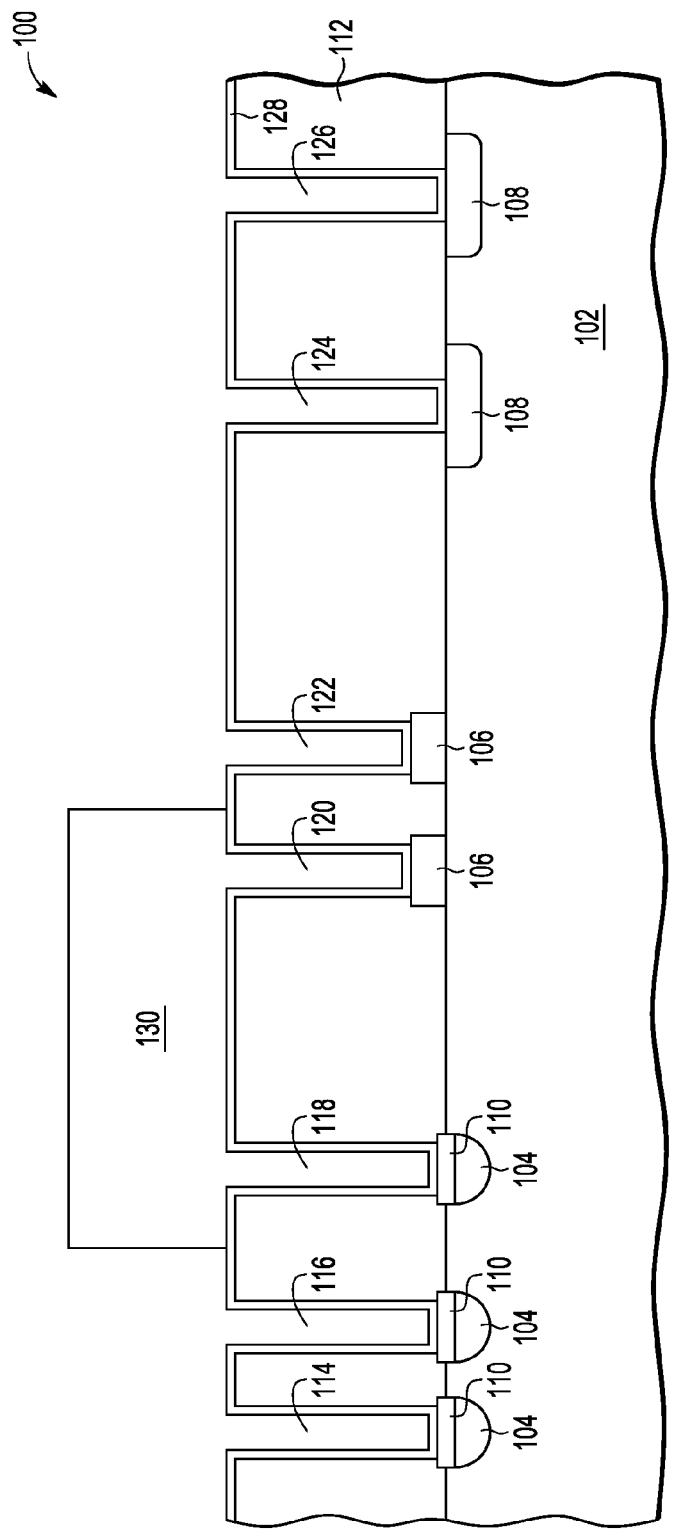

Referring to FIG. 4, semiconductor device 100 is shown after a subsequent phase of manufacture during which a layer of photoresist material 130 is deposited and patterned to protect dielectric layer 128 in locations where nonconductive vias are desired. In the example shown in FIG. 4, photoresist material 130 extends from between openings 116 and 118 to between openings 120 and 122 to protect openings 118, 120, while openings 114, 116, 122, 124, or 126 are not protected by photoresist material 130.

Figure 5:
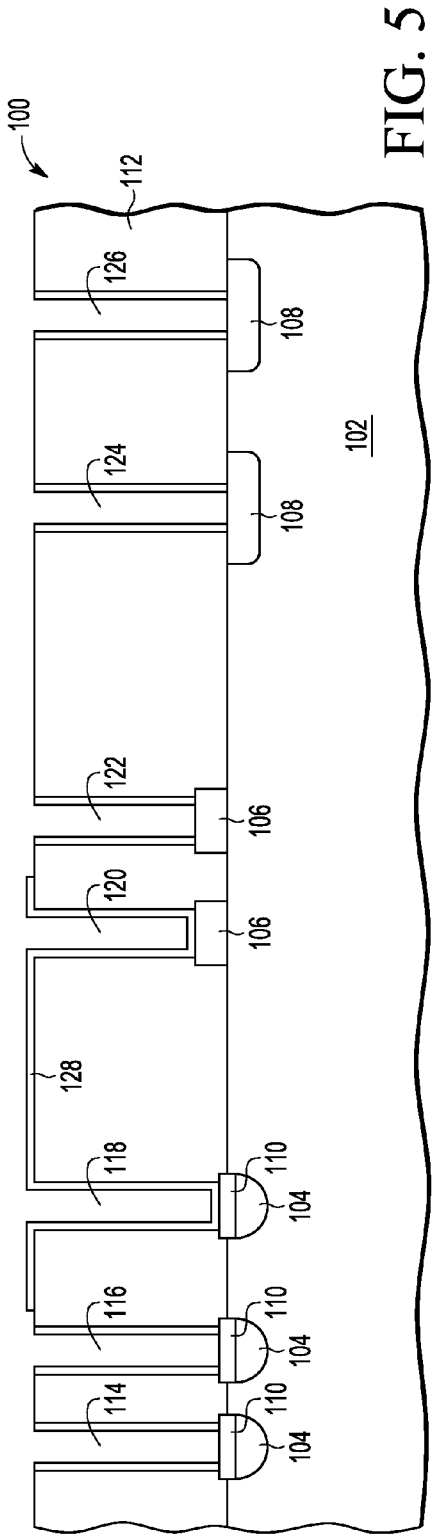

Referring to FIG. 5, semiconductor device 100 is shown after a subsequent phase of manufacture during which photoresist layer 130 (FIG. 4) and portions of dielectric layer 128 that were not protected by photoresist layer 130 were removed. In some embodiments, an anisotropic etch is used to remove photoresist layer 130 and unprotected portions of dielectric layer 128 so that dielectric layer 128 remains on the sidewalls of openings 114, 116, 122, 124 and 126, and on the sidewalls and bottoms of openings 118, 120. In other embodiments, an etching process that removes dielectric layer 128 from the sidewalls and bottoms of the openings 114, 116, 122, 124, 126 that are not protected by photoresist layer 130 can be used.

Figure 6:
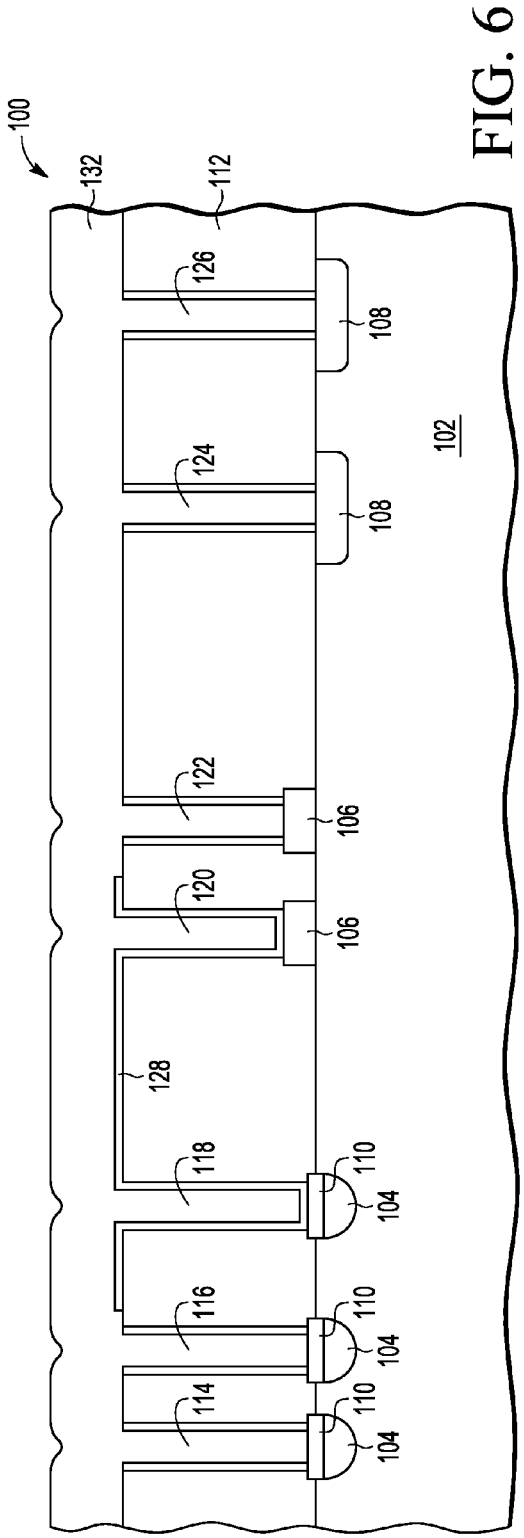

Referring to FIG. 6, semiconductor device 100 is shown after a subsequent phase of manufacture during which electrically conductive fill material 132 is deposited over dielectric layers 112, 128 and into openings 114-126. Fill material 132 can be a single layer of material or composed of a combination of a barrier material (not shown) and conductive fill material 132. Barrier material can include titanium, titanium nitride, and/or other suitable material(s). Fill material 132 can include aluminum, tungsten, copper, and/or other suitable conductive material(s).

Figure 7:
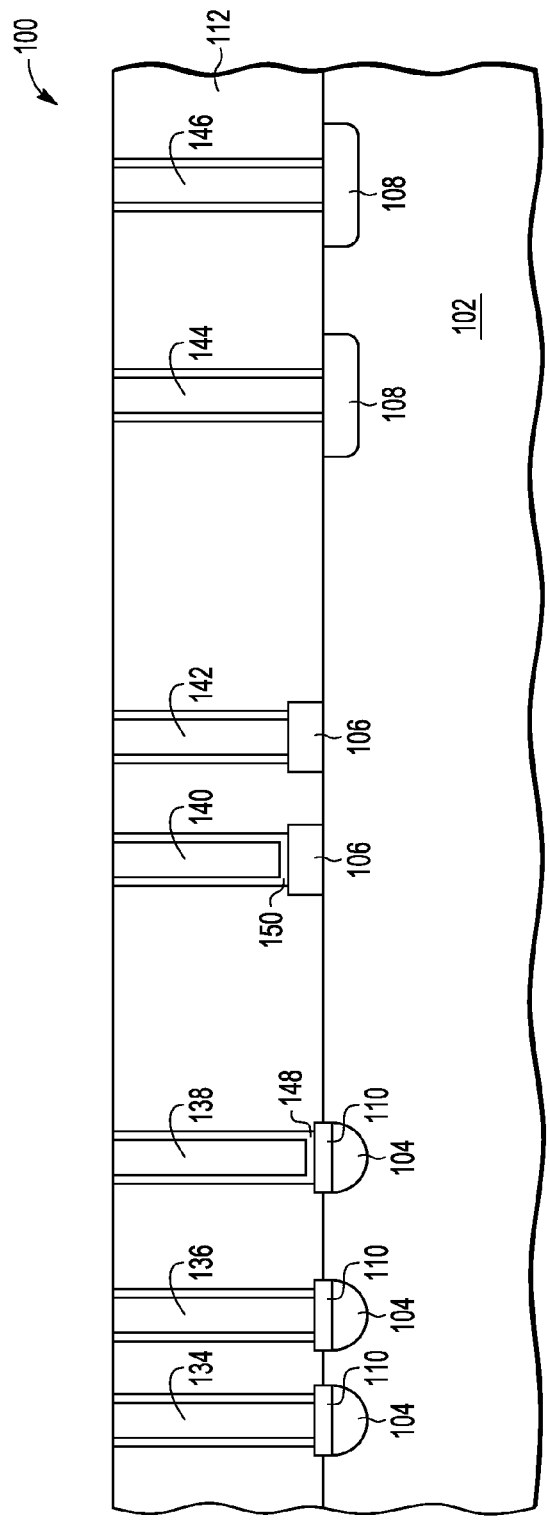

Referring to FIG. 7, semiconductor device 100 is shown after a subsequent phase of manufacture during which fill material 132 (FIG. 6) and the portions of dielectric material 128 (FIG. 6) overlying dielectric layer 112 are removed using a planarization technique such as chemical mechanical polishing or other suitable technique. Conductive vias 134, 136, 142, 144, 146 are thus formed in respective openings 114, 116, 122, 124, 126 (FIG. 6) and nonconductive vias 138, 140 are formed in respective openings 118, 120 (FIG. 6). Note that dielectric material 148 between doping region 104 and nonconductive via 138, and dielectric material 150 between gate interconnect 106 and nonconductive via 140 effectively prevent vias 138, 140 from conducting electricity between features below vias 138, 140 (i.e., doping region 104 and gate interconnect 106) and above vias 138, 140 (not shown).

Figure 8:
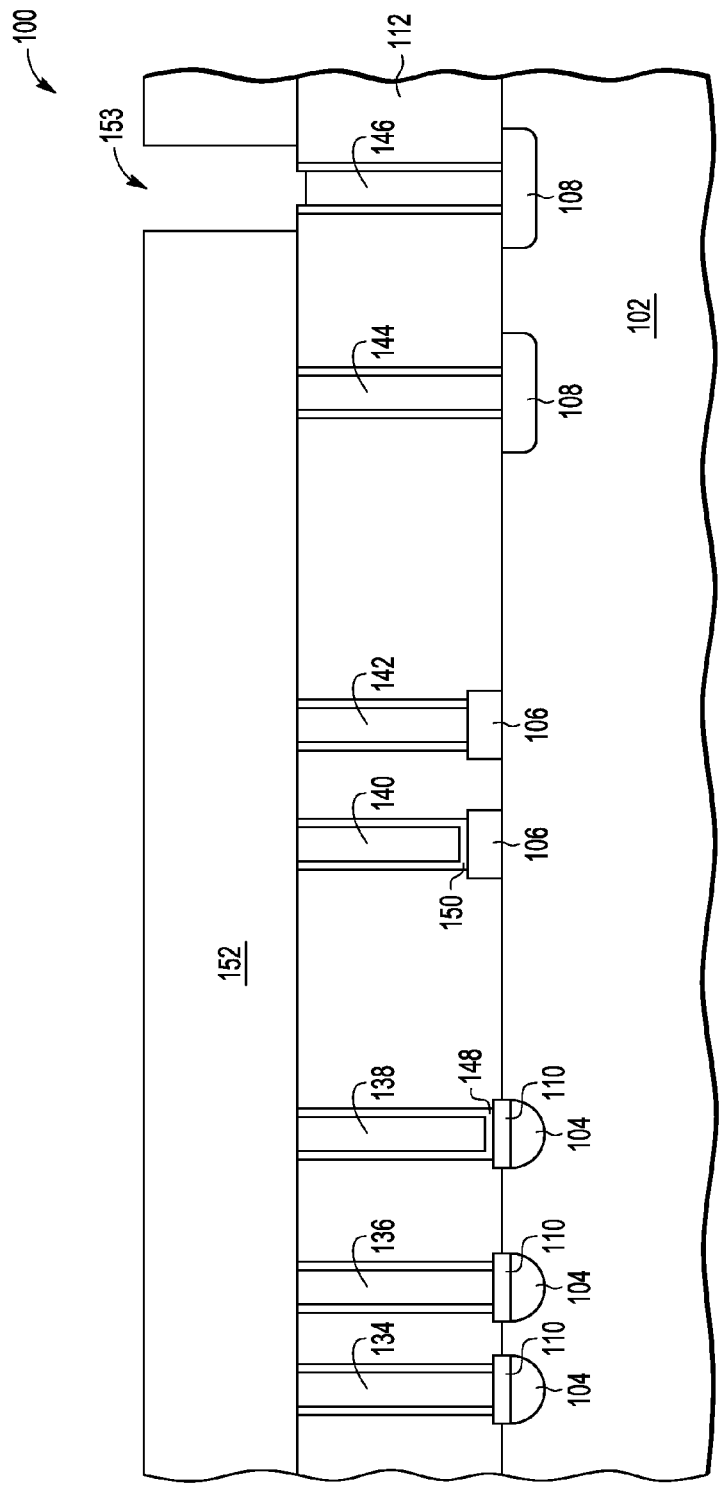

Referring to FIG. 8, semiconductor device 100 is shown after a subsequent phase of manufacture during which a layer of photoresist 152 is deposited and selectively patterned to form an opening 153 over via 146. A top portion of the electrically conductive fill material 132 in via 146 is removed during an etchback process or other suitable process on fill material 132 so that via 146 is recessed from the top of dielectric material 112 by a suitable amount, such as 100-200 Angstroms.

Figure 9:
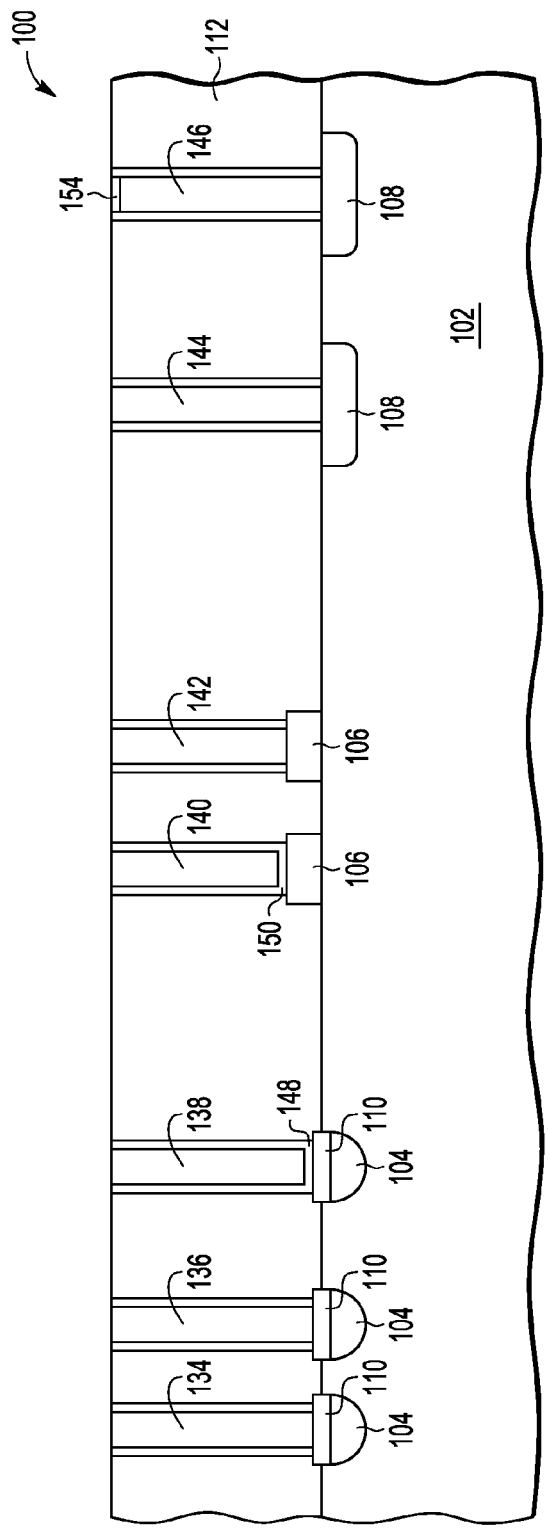

Referring to FIG. 9, semiconductor device 100 is shown after a subsequent phase of manufacture during which dielectric material 154 is placed, such as by deposition and polishing, over recessed via 146 to the top surface of dielectric layer 112. Dielectric material 154 performs a function similar to dielectric material 148, 150, namely, to prevent via 146 from conducting electric between features above (not shown) and below (i.e., doping region 108) via 146. Via 146 is now considered a nonconductive via 146.

Figure 10:
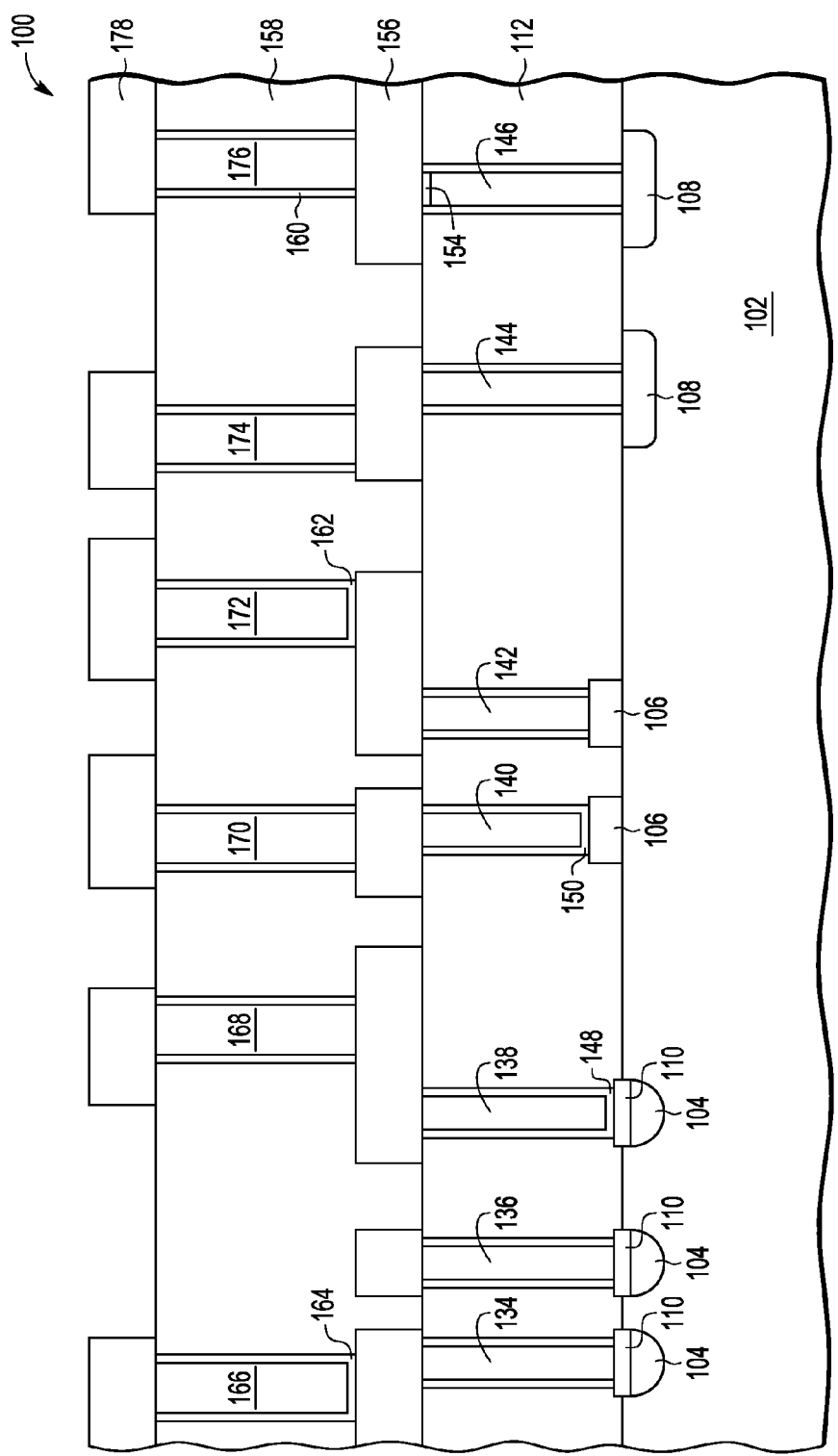

Referring to FIG. 10, semiconductor device 100 is shown after a subsequent phase of manufacture during which interconnects 156 are formed over vias 134-146. Dielectric layer 158 is deposited and patterned with openings over which a second layer of dielectric material 160 is conformally deposited over dielectric layer 158 and along the sidewalls and at the bottom of the openings. Dielectric layer 160 is selectively patterned and removed so that dielectric material 164, 162 remains over the bottom of selected openings 166, 172. Conductive material is then deposited in the openings to form conductive vias 168, 170, 174, 176, and nonconductive vias 166, 172. Dielectric material 162, 164 is shown at the bottom of the openings between respective vias 172, 166 and adjacent interconnects 156. Interconnects 178 are then formed over vias 166-176. While FIG. 10 shows interconnects 178 made through a subtractive etch process, for example conventional aluminum wiring, alternate embodiments may include interconnects 178 made through damascene wiring process, for example copper wiring.

Note that dielectric material 148, 150, 164, 162 are included at the bottom of respective nonconductive vias 138, 140, 164, 162 while dielectric material 154 is placed at the top of nonconductive via 154. The placement of dielectric material 148, 150, 164, 162, 154 at different levels makes sample preparation by lapping for retained dielectric detection very difficult, if not impossible. In other embodiments, surface irregularities or unevenness can be intentionally formed to create retained dielectric material for nonconductive vias at various intermediate levels to further inhibit detection of nonconductive vias.

Additional layers of circuitry can be added to semiconductor device 100 including additional conductive and nonconductive vias. In other embodiments, layers of circuitry including nonconductive vias can be implemented in individual die that are stacked over and connected to one another to provide desired processing capability or functionality.

FIGS. 11-13 show examples of schematic and standard cell diagrams for circuits in which nonconductive vias 138, 140, 164, 162 formed as described for semiconductor device 100 in FIGS. 1-10 can be used. Standard cells refer to combinations of basic circuit elements that are connected to form components such as logic gates routinely used in circuit design. The standard cells may be selected through a user interface of an electric circuit design system, and nonconductive vias can be used in the standard cells to provide the desired circuit functionality. For the purposes of this application, the term "via" includes conductive material coupling two metal layers, such as a metal layer to active or active silicide, or a metal layer to poly or poly silicide.

FIG. 11 shows a standard cell NAND gate 1100 and corresponding schematic diagram 1102 and trace diagram 1114. Schematic diagram 1102 includes MOSFETs 1104, 1106, 1108, 1110. The gate of MOSFET 1104 is coupled to the gate of MOSFET 1110, and the gate of MOSFET 1106 is coupled to the gate of MOSFET 1108. The gates of MOSFETS 1108, 1110 are coupled to a signal layer. The source of MOSFET 1110 is coupled to a power supply Vss and the drain of MOSFET 1104 is coupled to the drains of MOSFETS 1106 and 1108. The sources of MOSFETs 1104 and 1106 are coupled to a power supply Vdd. The source of MOSFET 1108 is coupled to the drain of MOSFET 1110.

Layout diagram 1114 shows a top view of the layout of active, poly regions 1122, 1124 and vias 1116, 1117, 1118, 1128 for NAND gate 1100 as implemented in a semiconductor device. The connecting signal layer for the internal nodes of NAND gate 1100 is not shown. Connecting structure 1119 is connected between nonconductive via 1116, conductive via 1117, and nonconductive via 1118 through first active region 1122 and second active region 1124 to couple the gates of MOSFETS 1104 and 1110 together to a signal layer. Connecting structure 1121 is connected between first and second active regions 1122, 1124 to couple the gates of MOSFETS 1106 and 1108 together. First active region 1122 includes source/drain conductive vias 1128 for MOSFETS 1104 and 1106. Second active region 1122 includes source/drain conductive vias 1128 for MOSFETS 1108, 1110.

FIG. 12 shows a standard cell logic "1"-generator circuit 1200 and corresponding schematic diagram 1202 and trace diagram 1206. Schematic diagram 1202 includes MOSFETs 1104, 1106, 1108, 1110. The gate of MOSFET 1104 is coupled to the gate of MOSFET 1110, and the gate of MOSFET 1106 is coupled to the gate of MOSFET 1108. The gate of MOSFET 1108 is coupled to a signal layer. The gate of MOSFET 1110 is coupled to Vss. The source of MOSFET is 1110 coupled to a power supply Vss and the drain of MOSFET 1104 is coupled to the drains of MOSFETS 1106 and 1108. The sources of MOSFETs 1104 and 1106 are coupled to a power supply Vdd. The source of MOSFET 1108 is coupled to the drain of MOSFET 1110.

Layout diagram 1206 shows a top view of the layout of active regions 1122, 1124 and vias 1116, 1208, 1120, 1128, 1210 for logic "1"-generator circuit 1200 as implemented in a semiconductor device. The connecting signal layer for the internal nodes of logic "1"-generator circuit 1200 is not shown. Structure 1219 is connected over active regions 1122 and 1124 between nonconductive via 1116, active region 1122, nonconductive via 1208, second active region 1124, and conductive via 1210 to couple the gates of MOSFETS 1104 and 1110 together to the power supply Vss. Connecting structure 1121 is connected between first and second active regions 1122, 1124 to couple the gates of MOSFETS 1106 and 1108 together. First active region 1122 includes source/drain conductive vias 1128 for MOSFETS 1104 and 1106. Second active region 1122 includes source/drain conductive vias 1128. for MOSFETS 1108, 1110.

FIG. 13 shows a standard cell inverter gate 1300 and corresponding schematic diagram 1302 and layout diagram 1304. Schematic diagram 1302 includes MOSFETs 1104, 1106, 1108, 1110. The gate of MOSFET 1104 is coupled to the gate of MOSFET 1110, and the gate of MOSFET 1106 is coupled to the gate of MOSFET 1108. The gate of MOSFET 1108 is coupled to a signal layer and the gate of MOSFET 1110 is coupled to Vdd. The source of MOSFET 1104 is coupled to a power supply Vdd and the drain of MOSFET 1104 is coupled to the drains of MOSFETS 1106 and 1108. The source of MOSFET 1106 is coupled to a power supply Vdd. The source of MOSFET 1108 is coupled to the drain of MOSFET 1110. The source of MOSFET 1110 is coupled to power supply Vss.

Layout diagram 1302 shows a top view of the layout of active regions 1122, 1124 and vias 1306, 1208, 1118, and 1128 for inverter gate 1300 as implemented in a semiconductor device. The connecting signal layer for the internal nodes of inverter gate 1300 is not shown. Structure 1319 is connected over active areas 1122 and 1124 between conductive via 1306, nonconductive via 1208, and nonconductive via 1118 to couple the gates of MOSFETS 1104 and 1110 together to Vdd. Connecting structure 1121 is connected between first and second active regions 1122, 1124 to couple the gates of MOSFETS 1106 and 1108 together. First active region 1122 includes source/drain conductive vias 1128 for MOSFETS 1104 and 1106. Second active region 1122 includes source/drain conductive vias 1128 for MOSFETS 1108, 1110.

Thus, as shown by the examples in FIGS. 11-13, various types of circuits can be specified with standard cells through selective use of nonconductive vias 1116, 1118, 1208. If the standard cells have a similar topology except for the use of conductive and nonconductive vias, it would be difficult to ascertain a circuit's functional topology during reverse engineering since the dielectric material would be removed along with the via's conductive material as layers of a device are removed.

Nonconductive vias can be used to thwart attempts to reverse engineer circuit designs by making it impossible to distinguish conductive and nonconductive vias. If a via that is meant to be nonconductive is implemented as a conductive via, the resulting circuit will not function as intended or desired. For example, the circuits in FIGS. 11, 12, and 13 can be configured as a NAND gate, a logic "1"-generator, or an inverter depending on which elements are implemented with nonconductive vias. Nonconductive vias can be used in various types of circuits including read-only memory designs, analog circuits, as well as circuit design systems that use standard cells.

By now it should be appreciated that in some embodiments, a method of forming structures of an electric device can comprise forming a dielectric layer 112 over a work piece 102, the work piece including a first conductive structure 110 and a second conductive structure 110; forming a first opening 116 in the dielectric layer to expose the first conductive structure and forming a second opening 118 in the dielectric layer to expose the second conductive structure; forming a third conductive structure 136 in the first opening; forming a fourth conductive structure 138 in the second opening; forming a dielectric structure 148 in the second opening; and forming a fifth conducive structure directly over the first opening. The third conductive structure electrically connects the first conductive structure to the fifth conductive structure. The method can further include forming a sixth conductive structure directly over the second opening. The dielectric structure can prevent the fourth conductive structure from electrically connecting the second conductive structure to the sixth conductive structure.

In another aspect, forming the dielectric structure can include forming a second dielectric layer 128 over the dielectric layer after the forming the first opening and the second opening. The second dielectric layer can be formed in the first opening and in the second opening. The method can include selectively removing portions of the second dielectric layer. The selectively removing removes at least a portion of the second dielectric layer in the first opening to expose the first conductive structure. The selectively removing leaves a second portion 148 of the second dielectric layer in the second opening. The dielectric structure can be at least a portion of the second portion of the second dielectric layer.

In another aspect, the forming the third conductive structure and the forming the fourth conductive structure include forming a layer of conductive fill material 132 over the dielectric layer and in the first opening and in the second opening after the selectively removing portions of the second dielectric layer.

In another aspect, the forming the third conductive structure and the fourth conductive structure can include forming conductive fill material in the first opening and in the second opening respectively. A portion of the conductive fill material can be removed to reduce a height of the conductive fill material in the second opening. Conductive fill material is not removed from the first opening when the conductive fill material is removed from the second opening. Forming the dielectric structure 154 can include forming a dielectric material in the second opening over the conductive fill material in the second opening after the portion of the conductive fill material is removed to reduce the height of the conductive fill material in the second opening.

In another aspect, forming the conductive fill material 132 in the first opening and in the second opening can include forming a layer of conductive fill material over the dielectric layer and in the first opening and in the second opening.

In another aspect, the first conductive structure and the second conductive structure can be characterized as a first control terminal structure 106 and a second control terminal structure for a first a first transistor and a second transistor, respectively, of the work piece.

In another aspect, the fifth conductive structure and the sixth conductive structure can be characterized as a first conductive interconnect and a second conductive interconnect, respectively, of an interconnect layer of the electric device.

In another aspect, the first conductive structure and the second conductive structure can be characterized as a first conductive interconnect and a second conductive interconnect, respectively, of an interconnect layer of the electric device.

In another aspect, the first conductive structure and the second conductive structure can be characterized as a first silicide structure 110 on a first doped well region of a substrate and second silicide structure 110 on a second doped well region 106, respectively, of a semiconductor material of the work piece.

In further embodiments, an electric device can comprise a first conductive structure 110; a second conductive structure 110; a dielectric layer 112 over the first consecutive structure and the second conductive structure; a third conductive structure 136 located over the dielectric layer; a fourth conductive structure 138 located over the dielectric layer, a first via 136 extending from the first conductive structure to the third conductive structure through the dielectric layer, the first via including conductive material that electrically connects the first connective structure and the third conductive structure. A second via 138 extending from the second conductive structure to the fourth conductive structure though the dielectric layer. The second via can include conductive material, the second via can include a dielectric structure 148 that prevents the conductive material of the second via from electrically connecting the second conductive structure to the fourth conductive structure.

In another aspect, the dielectric structure can include at least a portion located under the conductive material of the second via.

In another aspect, the dielectric structure 154 can include at least a portion located over the conductive material of the second via.

In another aspect, the first conductive structure 106 and the second conductive structure can be characterized as a first control terminal structure and a second control terminal structure for a first a first transistor and a second transistor, respectively.

In another aspect, the third conductive structure and the fourth conductive structure can be characterized as a first conductive interconnect and a second conductive interconnect, respectively, of an interconnect layer 156 of the electric device.

In another aspect, the first conductive structure and the second conductive structure can be characterized as a first conductive interconnect and a second conductive interconnect, respectively, of an interconnect layer of the electric device.

In another aspect, the first conductive structure 110 and the second conductive structure 110 can be characterized as a first silicide structure on a first doped well region of a substrate and second silicide structure on a second doped well region of the substrate, respectively.

In other embodiments, an electric device can comprise a first standard cell 1114 implementing a first circuit function, and a second standard cell 1206 implementing a second circuit function, the second circuit function being different than the first circuit function. The first standard cell can include a first connector structure 1119 located over a substrate and two transistors 1104,1110 implemented in the substrate. The second standard cell can include a second connector structure located over the substrate and two transistors 1104, 1110 implemented in the substrate. The first connector structure and transistors of the first standard cell have an identical layout as the second connector structure and transistors of the second standard cell. The first standard cell can include a first via 1117 and a second via 1118, the first via extends from the first connector structure at a first location of the first connector structure to a first conductive interconnect, the second via extends from the first connector structure at a second location of the first connector structure to a second conductive interconnect. The first via can include electrically conductive material electrically connecting the first connector structure to the first conductive interconnect. The second via can include conductive material and a first dielectric structure. The first dielectric structure prevents the conductive material of the second via from electrically connecting the first connector structure to the second conductive interconnect. The second standard cell can include a third via 1210 and a fourth via 1208, the third via extends from the second connector structure at a third location of the second connector structure to a third conductive interconnect, the fourth via extends from the second connector structure at a fourth location of the second connector structure to a fourth conductive interconnect. The third via can include electrically conductive material electrically connecting the second connector structure to the third conductive interconnect. The fourth via can include conductive material and a second dielectric structure. The second dielectric structure prevents the conductive material of the fourth via from electrically connecting the second connector structure to the fourth conductive interconnect. The first location of the first standard cell corresponds to the fourth location of the second standard cell and the second location of the first standard cell corresponds to the third location of the second standard cell.

In another aspect, the first connector structure can be characterized a control terminal structure that serves as a control terminal for the two transistors of the first standard cell. The second connector structure can be characterized a control terminal structure that serves as a control terminal for the two transistors of the second standard cell.

In another aspect, a layout of the transistors of the first standard cell can be identical to a layout of the transistors of the second standard cell.

In another aspect, the second conductive interconnect can be electrically coupled the third conductive interconnect.

Because the apparatus implementing the present disclosure is, for the most part, composed of electric components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The semiconductor substrate used in with the semiconductor device disclosed herein can be any semiconductor material or combinations of materials, such as gallium arsenide, silicon germanium, silicon-on-insulator (SOI), silicon, monocrystalline silicon, the like, and combinations of the above.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An electric device comprising:
a first conductive structure;
a second conductive structure;
a dielectric layer over the first conductive structure and the second conductive structure;
a third conductive structure located over the dielectric layer;
a fourth conductive structure located over and in direct contact with the dielectric layer,
a first via extending from the first conductive structure to the third conductive structure through the dielectric layer, the first via including conductive material that electrically connects the first connective structure and the third conductive structure;
a second via extending from the second conductive structure to the fourth conductive structure though the dielectric layer, wherein the second via includes conductive material, the second via includes a dielectric structure that prevents the conductive material of the second via from electrically connecting the second conductive structure to the fourth conductive structure, further wherein the first conductive structure and the second conductive structure are characterized as a first control terminal structure and a second control terminal structure for a first a first transistor and a second transistor, respectively; and a doped region under each of the first and second conductive structures.

2. The electric device of claim 1 wherein the dielectric structure includes at least a portion located under the conductive material of the second via.

3. The electric device of claim 1 wherein the dielectric structure includes at least a portion located over the conductive material of the second via.

4. The electric device of claim 1 wherein the third conductive structure and the fourth conductive structure are characterized as a first conductive interconnect and a second conductive interconnect, respectively, of an interconnect layer of the electric device.

5. The electric device of claim 1 wherein the first conductive structure and the second conductive structure are characterized as a first conductive interconnect and a second conductive interconnect, respectively, of an interconnect layer of the electric device.

6. The electric device of claim 1 wherein the first conductive structure and the second conductive structure are characterized as a first silicide structure on a first doped well region of a substrate and second silicide structure on a second doped well region of the substrate, respectively.

7. An electric device comprising:
a first standard cell implementing a first circuit function, a second standard cell implementing a second circuit function, the second circuit function being different than the first circuit function;
wherein the first standard cell includes a first connector structure located over a substrate and two transistors implemented in the substrate;
wherein the second standard cell includes a second connector structure located over the substrate and two transistors implemented in the substrate;
wherein the first connector structure and transistors of the first standard cell have an identical layout as the second connector structure and transistors of the second standard cell;
wherein the first standard cell includes a first via and a second via, the first via extends from the first connector structure at a first location of the first connector structure to a first conductive interconnect, the second via extends from the first connector structure at a second location of the first connector structure to a second conductive interconnect, wherein the first via includes electrically conductive material electrically connecting the first connector structure to the first conductive interconnect, wherein the second via includes conductive material and a first dielectric structure, wherein the first dielectric structure prevents the conductive material of the second via from electrically connecting the first connector structure to the second conductive interconnect;
wherein the second standard cell includes a third via and a fourth via, the third via extends from the second connector structure at a third location of the second connector structure to a third conductive interconnect, the fourth via extends from the second connector structure at a fourth location of the second connector structure to a fourth conductive interconnect, wherein the third via includes electrically conductive material electrically connecting the second connector structure to the third conductive interconnect, wherein the fourth via includes conductive material and a second dielectric structure, wherein the second dielectric structure prevents the conductive material of the fourth via from electrically connecting the second connector structure to the fourth conductive interconnect; and
wherein the first location of the first standard cell corresponds to the fourth location of the second standard cell and the second location of the first standard cell corresponds to the third location of the second standard cell.

8. The electric device of claim 7 wherein:
the first connector structure is characterized a control terminal structure that serves as a control terminal for the two transistors of the first standard cell; and
the second connector structure is characterized a control terminal structure that serves as a control terminal for the two transistors of the second standard cell.

9. The electric device of claim 7 wherein a layout of the transistors of the first standard cell is identical to a layout of the transistors of the second standard cell.

10. The electric device of claim 7 wherein the second conductive interconnect is electrically coupled the third conductive interconnect.

11. An electric device comprising:
a dielectric layer formed over a work piece, the work piece including a first conductive structure and a second conductive structure; and a doped region under each of the first and second conductive structures;

a first opening formed in the dielectric layer to expose the first conductive structure and a second opening in the dielectric layer to expose the second conductive structure;

a third conductive structure formed in the first opening;

a fourth conductive structure formed in the second opening;

a dielectric structure formed in the second opening, wherein the dielectric structure is in direct contact with the dielectric layer;

a fifth conductive structure formed directly over the first opening, wherein the third conductive structure electrically connects the first conductive structure to the fifth conductive structure; and a sixth conductive structure formed directly over the second opening, wherein the dielectric structure prevents the fourth conductive structure from electrically connecting the second conductive structure to the sixth conductive structure, wherein the first conductive structure and the second conductive structure are characterized as a first silicide structure on a first doped well region of a substrate and second silicide structure on a second doped well region, respectively, of a semiconductor material of the work piece, and the first conductive structure and the second conductive structure are characterized as a first control terminal structure and a second control terminal structure for a first a first transistor and a second transistor, respectively, of the work piece.

12. The device of claim 11 wherein the dielectric structure includes a second dielectric layer formed over the dielectric layer, wherein the second dielectric layer is formed in the first opening and in the second opening.

13. The device of claim 12 wherein the third conductive structure and the fourth conductive structure include a layer of conductive fill material over the dielectric layer and in the first opening and in the second opening.

14. The device of claim 11 wherein the third conductive structure and the fourth conductive structure include conductive fill material in the first opening and in the second opening respectively, wherein the dielectric structure includes a dielectric material in the second opening over the conductive fill material in the second opening.

15. The device of claim 14 wherein the conductive fill material in the first opening and in the second opening includes a layer of conductive fill material formed over the dielectric layer and in the first opening and in the second opening.

16. The device of claim 11 wherein the fifth conductive structure and the sixth conductive structure are characterized as a first conductive interconnect and a second conductive interconnect, respectively, of an interconnect layer of the electric device.

17. The device of claim 11 wherein the first conductive structure and the second conductive structure are characterized as a first conductive interconnect and a second conductive interconnect, respectively, of an interconnect layer of the electric device.

* * * * *